United States Patent [19]
Givens

[11] Patent Number: 6,087,711
[45] Date of Patent: Jul. 11, 2000

[54] INTEGRATED CIRCUIT METALLIZATION WITH SUPERCONDUCTOR BEOL WIRING

[75] Inventor: John H. Givens, Meridian, Id.

[73] Assignee: Micron Technology Inc., Boise, Id.

[21] Appl. No.: 09/024,234

[22] Filed: Feb. 17, 1998

Related U.S. Application Data

[62] Division of application No. 08/801,811, Feb. 14, 1997, Pat. No. 5,908,813.

[51] Int. Cl.$^7$ .......................... H01L 39/00; H01L 29/06; H01L 39/22; H01L 23/48
[52] U.S. Cl. .......................... 257/661; 257/37; 257/662; 257/663; 257/750; 257/33
[58] Field of Search .................. 257/37–39, 661–663, 257/758–760, 32, 33, 750

[56] References Cited

U.S. PATENT DOCUMENTS

| | | | |
|---|---|---|---|
| 4,837,609 | 6/1989 | Gurvitch et al. | 257/663 |
| 4,965,248 | 10/1990 | Poppe et al. | 505/1 |
| 5,010,053 | 4/1991 | Maroni | 505/1 |
| 5,079,223 | 1/1992 | Maroni | 505/1 |
| 5,141,917 | 8/1992 | Tanaka et al. | 505/1 |
| 5,183,800 | 2/1993 | Nakagawa | 505/1 |
| 5,196,379 | 3/1993 | Weaver et al. | 505/1 |
| 5,200,389 | 4/1993 | Tachikawa et al. | 505/1 |
| 5,206,213 | 4/1993 | Cuomo et al. | 505/1 |
| 5,274,268 | 12/1993 | Yamazaki | 257/663 |
| 5,311,036 | 5/1994 | Nishino et al. | 257/30 |
| 5,471,069 | 11/1995 | Nakamura et al. | 257/39 |
| 5,550,389 | 8/1996 | Nishino et al. | 257/30 |
| 5,710,462 | 1/1998 | Mizushima et al. | 257/758 |
| 5,897,367 | 4/1999 | Kerber et al. | 438/622 |

FOREIGN PATENT DOCUMENTS

| | | | |
|---|---|---|---|
| 0 439 751 A2 | 8/1991 | European Pat. Off. | 257/37 |

OTHER PUBLICATIONS

Nastasi, et al., Appl. Phys. Lett. 52(20) May 1988, p. 1729–1731.

Hubbard, et al., J. Appl. Phys. 69(4) Feb. 1991, p. 2397–2404.

Severin, et al., Mat. Res. Bull., vol. 23, pp. 707–717,1998.

*Primary Examiner*—Mahshid Saadat
*Assistant Examiner*—Allan R. Wilson
*Attorney, Agent, or Firm*—Workman, Nydegger & Seeley

[57] ABSTRACT

The present invention discloses an integrated circuit that is wired with a high-temperature superconductive material that is superconductive at temperatures of about 70° K and above, and methods of making the integrated circuit. The front-end manufactured semiconductor structure is patterned with a preferred precursor metal or metal oxide and a complementary compound is superposed and reacted to form wiring lines of superconductor ceramics that complete integrated circuits within the front-end manufactured semiconductor structure. The front-end manufactured semiconductor structure is alternatively patterned first with the complementary compound and the precursor metal is thinly patterned by ion implantation. The front-end manufactured semiconductor structure is then treated to form wiring lines of superconductor ceramics that complete integrated circuits within structure. The conductive lines, if formed within an oxidized portion of the complementary compound, are self-insulating by the presence of the oxided complementary compound. Operation of the devices is accomplished at "high" superconductive temperatures that cause improved solid state operation of the device, minimizing molecular vibrations and dislocation effects, and cause the wiring to be superconductive.

40 Claims, 3 Drawing Sheets

INTEGRATED CIRCUIT METALLIZATION WITH SUPERCONDUCTOR BEOL WIRING

This is a divisional patent application of U.S. patent application Ser. No. 08/801,811, filed on Feb. 14, 1997, now U.S. Pat. No. 5,908,813, titled Method of Making INTEGRATED CIRCUIT METALLIZATION WITH SUPERCONDUCTOR BEOL WIRING, which is incorporated herein by reference.

BACKGROUND OF THE INVENTION

1. The Field of the Invention

This invention relates to semiconductor devices upon a semiconductor substrate as they are electrically connected to each other to complete integrated circuits. More particularly, the invention relates to semiconductor devices upon a semiconductor substrate having electrical connections with the property of high-temperature (ie. above about 70° K) superconductivity.

2. The Relevant Technology

Semiconductor processing involves a number of different chemical and physical steps whereby minute electronic devices are created on a substrate at the front end of a fabrication process. Integrated circuits are constructed using multilayers of interrelated patterns of various materials, the layers being created by such processes as chemical vapor deposition (CVD), physical vapor deposition (PVD), and epitaxial growth. Some layers are patterned using photoresist masks and followed by wet and dry etching techniques.

Patterns are created within layers by the implantation of dopants at particular locations. The substrate upon which the devices are created may be silicon, gallium arsenide, glass, or other appropriate material.

In the production of integrated circuits upon semiconductor wafers, the back end of production involves connecting all the fabricated semiconductor devices on the chip with electrically conductive materials. This back-end-of-line (BEOL) "wiring" step, which is the electrical connection scheme for connecting semiconductor devices, completes the circuits as designed to function within the total integrated circuit device. Metal lines are used in the metallization process as electrical connections between semiconductor devices.

Several technical challenges arise for back-end wiring as more complex integrated circuitry is increasingly miniaturized upon semiconducting dies. One problem is Joule heat generation caused by resistive current flow through the metallization or wiring. A side-effect of heat generation due to resistive current flow is electromigration of certain preferred electrical conductors such as aluminum and copper. Electromigration is the diffusion of atoms in electric fields in the metal wiring that results in wire thinning and ultimate breach and failure after it has been put into service. Such a phenomenon eventually opens the circuit by breaking the metal line and the device fails. A second heat problem is the side effect of device failure from overheating. Because heat is a product of the resistive-current flow process, a device with inadequate heat removal abilities causes the device to inadequately reject heat until resistivity increases to the point of device failure. The system can recover by shutting down and allowing the whole system to cool. Valuable time, however, is lost, a process controlled by the device runs without control, or information is lost.

Another problem is capacitance build-up between metallization lines that are separated by dielectrics. The need for ever-decreasing dielectric layer thicknesses makes capacitance build-up more likely as the distance between metal lines decreases. Undesired capacitance build-up creates unwanted electronic phenomena within the integrated circuit called cross-talk that causes marginal device function or device failure.

Yet another problem is the ever-decreasing metal line width requirement that makes metallization by photolithographic and sputtering techniques more difficult to achieve. As sub-tenths of micron line widths are being attempted, a technique for achieving thinner but continuous and adequately conductive metal lines is required.

The initial scientific breakthroughs in the superconductor art more than a decade ago were with 123 $YBaCuO_x$ compounds, but since their discovery, several higher-temperature superconductors have been developed such as $REBaCuO_x$, 2223 BSCCO (Bismuth-Strontium-Calcium-Copper oxide), and Thallium-Bismuth-Lead copper oxides among, others. Superconductors have the advantage of low resistance conduction of electricity.

It would be an advantage in the semiconductor art to use the low resistance of superconductors in the metallization process of semiconductor device fabrication.

SUMMARY OF THE INVENTION

The present invention addresses metallization of integrated circuit devices situated on a substrate assembly. The term substrate assembly is intended herein to mean a substrate having one or more layers or structures formed thereon. As such, the substrate assembly may be, by way of example and not by way of limitation, a doped silicon semiconductor substrate typical of a semiconductor device structure.

Metal lines are used as electrical connections between semiconductor devices. The electrical connections are made of high-temperature superconductor ceramic oxides. The metal lines are formed into an electrical connection or wiring scheme for connecting semiconductor devices with high-temperature superconductor ceramic oxides.

The inventive method of the present invention for metallizing a structure situated on a substrate assembly, in general, has a variety of embodiments. Initially, a structure is provided having an upper surface. The structure is situated on a substrate assembly. A compound is deposited upon the upper surface of the structure, and the compound is then implanted with metal ions of a metal material to form a metal line in a metal-compound composite. Alternatively, a metal layer can be formed into a metal line on the upper surface of the structure and a compound can then be deposited thereon. In either case, the materials of the metal and the compound are combined.

The metal line can be formed or patterned as having a two dimensional shape, and the material of the metal can be substantially composed of a material selected from a group consisting of copper, barium, yttrium, rare earth metals, thallium, strontium, gold, silver, bismuth, their equivalents, their oxides, or combinations thereof.

The metal and compound, when so combined, are treated at sufficient conditions to react the metal material and the compound so as to form a high-temperature superconductive ceramic oxide substantially composed of a superconductor film upon the upper surface of the structure, such as 1-2-3 $YBaCuO_x$ for example. The resultant high-temperature superconductive ceramic oxide will have the two dimensional shape of the metal layer or implanted metal ions.

The metal line and compound can be repeatedly layered, and the step of reacting the metal line and compound together to form the high-temperature superconductive ceramic oxide can be performed after the formation of each layer, or after the formation of all layers It is preferable that the compound is the superconductor ceramic complement to the material of the metal line, and that the high-temperature superconductive ceramic oxide upon the upper surface of the structure be intermingled with excess metal material. The high-temperature superconductive ceramic oxide can be formed with the inventive method so as to have a width of less than 0.1 μm, and a thickness of less than 1000 Å.

BRIEF DESCRIPTION OF THE DRAWINGS

A more particular description of the invention briefly described above will be rendered by reference to specific embodiments thereof which are illustrated in the appended drawings. Understanding that these drawings depict only typical embodiments of the invention and are not therefore to be considered to be limiting of its scope, the invention will be described and explained with additional specificity and detail through the use of the accompanying drawings in which.

DETAILED DESCRIPTION OF THE PREFERRED EMBODIMENTS

Back-end-of-line (BEOL) superconductive semiconductor devices are described herein. BEOL superconductive semiconductor devices are created where the microelectronic structures manufactured at the front end of a manufacturing line, operate at a new level of solid-state efficiency. This new efficiency is due to operation of the semiconductor device structures in a "frozen out" state, and where BEOL wiring operates in the superconductive state. The semiconductor devices are designed to operate at the high temperature superconductor range that has been developed over the last decade or more. It is intended herein that the term high-temperature superconductive material be interpreted to mean a material that is superconductive at temperatures in a range from about 70° K to about 150° K and higher.

Two process options and their variations are available to fabricate this class of semiconductor devices. The first option is to deposit, pattern, and etch a seed layer of a preferred metal or metal oxide that will be covered with a complementary compound layer that, upon reacting, forms a superconducting phase. The inventive method of metallizing a structure situated on a substrate assembly is accomplished by a method that begins with providing a structure having an upper surface, the structure being situated on a substrate assembly. A metal layer is formed upon the upper surface of the structure and a compound is deposited upon the upper surface of the structure. The substrate assembly is then treated at sufficient conditions to react the metal layer and the compound so as to form a high-temperature superconductive ceramic oxide upon the upper surface of the structure. Depositing the compound may either precede or follow forming the metal layer, depending upon the specific application.

Deposition of the metal layer can be done by sputtering, evaporation, or wet chemistry such as electroplating or electrode-less plating. Patterning is done by conventional photolithography and etching processes.

Figure 1:
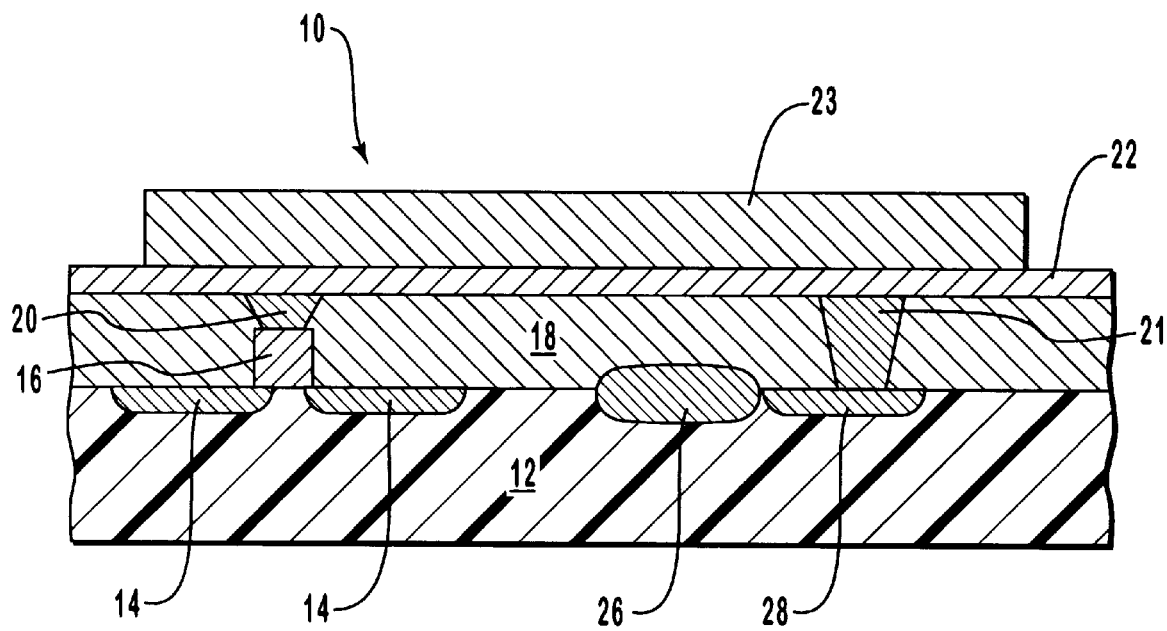
FIG. 1 is a cross sectional depiction of a semiconductor device with a layer of photoresist covering a copper or oxide layer that connects two metal-filled vias prior to an etch that exposes the copper or oxide layer.

FIG. 1 shows a structure 10 situated on silicon substrate assembly 12. By way of example, and not by way of limitation, silicon substrate assembly 12 can be a doped silicon semiconductor substrate typical of a semiconductor wafer. A field oxide region 26 and active areas 14, 28 are situated within silicon substrate assembly 12. A gate 16 and two (2) copper filled vias 20, 21 are within an oxide layer 18. A metal or oxide seed layer 22 can be deposited by PVD or CVD upon oxide layer 18 of structure 10. Depending upon the required wiring geometry, metal or oxide seed layer 22 can be blanket deposited, then patterned and etched using photoresist and etch media. Alternatively, metal or oxide seed layer 22 can be deposited over a patterned photoresist that is removed to leave a patterned metal or oxide seed layer 22 negative to the photoresist. In FIG. 1, metal or oxide seed layer 22 has been blanket deposited and a photoresist 23 has been superposed and patterned prior to a patterning etch that will leave a patterned metal or oxide layer 24 upon the oxide layer 18.

Figure 2:
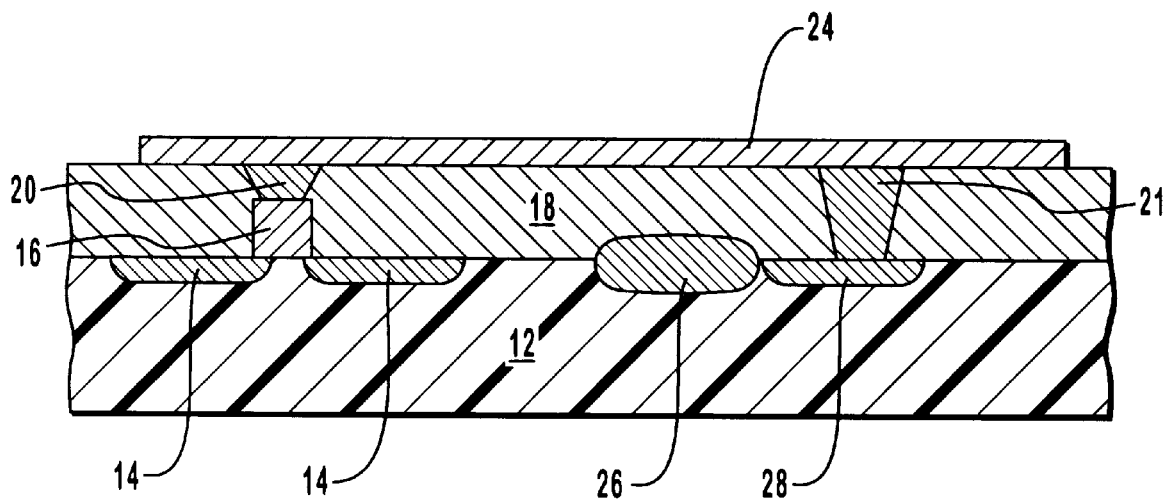
FIG. 2 is a cross sectional depiction of the semiconductor device seen in FIG. 1 where there is illustrated a completed semiconductor device having a superconducting connection between the two metal-filled vias, subsequent to the etch that exposes the copper or oxide layer.

Metal or oxide seed layer 22 is seen in FIG. 2 after it has been patterned according to patterned metal or oxide layer 24 seen in FIG. 1. A complementary compound is required to react with metal or oxide seed layer 22. As such, a layer of a complementary compound is superposed upon metal or oxide seed layer 22. Like metal or oxide seed layer 22, the layer of the complementary compound can be either blanket deposited or superposed over metal or oxide seed layer 22 through a photoresist. Both the blanket deposited and the superpositioning of the layer of the complementary compound are discussed below.

A superconducting phase is formed by reaction of metal or oxide seed layer 22 with complementary compound of the materials making up metal or oxide seed layer 22. After the step of reacting the complementary compound with metal or oxide seed layer 22, there is left a self-insulated superconductor structure upon oxide layer 18, specifically when the complementary compound is blanket deposited. Where the reacted metal or oxide seed layer 22 does not lie under the blanket-deposited complementary compound, a dielectric blanket layer is formed.

Because of partial step coverage and the non-planar nature of the blanket-deposited complementary compound, some planarization may be required if the reacted metal or oxide seed layer 22 is not the final upper surface of the device and a topographically non-planar surface would be detrimental to the resultant structure after further layering.

The non-planar nature of the blanket-deposited complementary compound leaves a topographically prominent "metallization" line of high temperature superconductive ceramic that can be planarized as are conventionally formed dielectrics such as oxides. Alternatively, the semiconductor structure may be sealed with a preferred ceramic or epoxy if BEOL wiring is complete. In the case of oxidation to planarize, where a subsequent structure is to be formed on top, the oxide growth is tightly controlled. This tight control avoids a subsequent planarization step because the superconductive ceramic compound is more brittle than conventional metallization, and planarization places an appreciable amount of fracture stress upon the structure. With the brittle ceramic circuit lines being the most prominent upper feature, planarization exposes these lines to brittle failure.

Another alternative for BEOL superconductive metal lines is to blanket deposit a precursor compound followed by a patterned ion-implantation of a complementary metal(s) and reacting the precursor compound with the complementary ions to form superconducting metal lines. An alternative process for forming BEOL superconductive metal lines is to deposit and pattern a precursor compound, and then ion implant within the center lines of the pattern as above. Next, an optional oxidation or oxide deposition is performed in the metal line interstices so as to form a planarized structure upon the present upper face of the semiconductor structure, where superconducting metal lines are contained within the planarized structure.

The inventive method of metallizing a structure situated on a substrate assembly is carried out by a method that begins with providing a structure having an upper surface, the structure being situated on a substrate assembly. A metal layer is formed upon the upper surface of the structure and a compound is deposited upon the upper surface of the structure. The substrate assembly is then treated at sufficient conditions to react the metal layer and the compound so as to form a high-temperature superconductive ceramic oxide upon the upper surface of the structure. Depositing the compound may either precede or follow forming the metal layer, depending upon the specific application.

Figure 3:
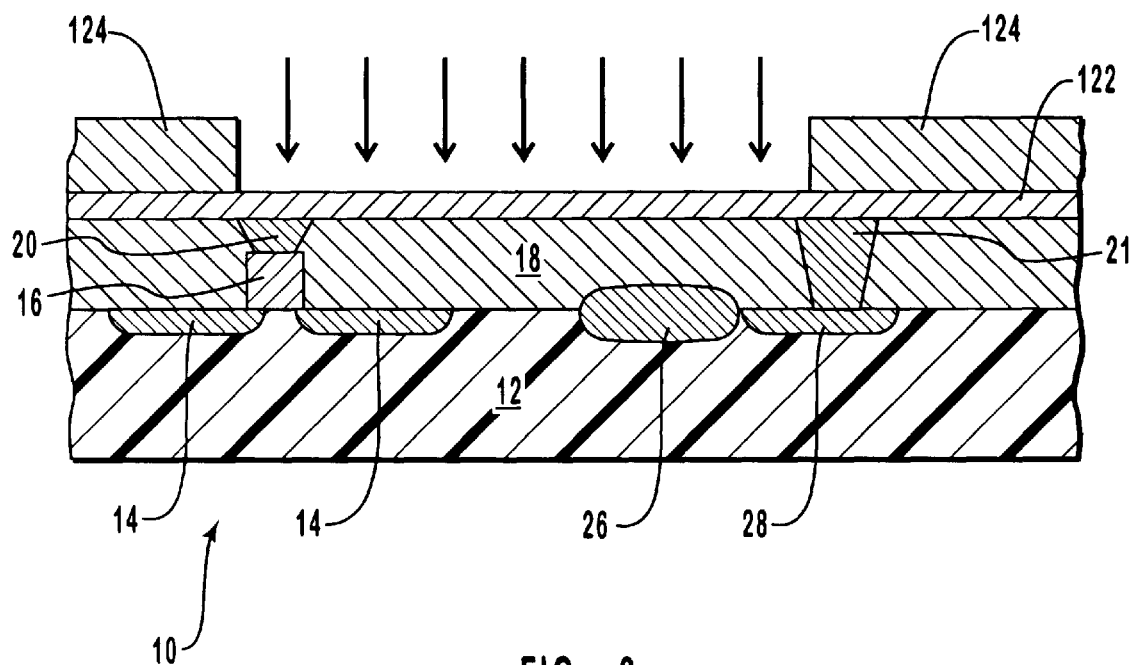
FIG. 3 is a cross sectional depiction of metal line created by implanting copper into an oxide layer so as to react the copper with the oxide layer and thereby form a complete superconductive metal line.

FIG. 3 illustrates a step in the preparation of a device 10 by ion implantation into a complementary compound field 122 that is patterned with a blocking mask 124.

A preferred embodiment of the inventive method incorporates the step of blanket depositing of the precursor compounds that will be combinable to form, for example, a 1-2-3 $YBaCuO_x$ superconductor. This is done by CVD depositing of a YBa film, implanting at least stoichiometric amounts of Cu ions in a patterned form, and reacting the YBa film and the Cu ions in the presence of oxygen to form 1-2-3 $YBaCuO_x$ patterned lines that are self-insulated with $YBaO_x$ interstices.

Because ion implantation can be focused below the quarter micron width (the present limit to photolithography patterning techniques), the advantage of ion implantation of metals into precursor compounds is that increasingly thinner metallization wiring can be accomplished that facilitates the relentless pressure to further miniaturize.

One quality of high-temperature superconductive metallization lines is that thinner wiring can be formed that can conduct as much current as wires of conventionally dimensioned wires, thus avoiding limitations known to conventional thin lines. As such, thin superconducting wiring serves the goal of miniaturization because it achieves the same and even higher current-flow duty capabilities as compared to conventional wiring.

The width of a superconducting wire is theoretically dependent, at the minimum, upon the ability to produce a continuous monomolecular superconducting ceramic wiring line. Presently, the inventive method can form a high-temperature superconductive ceramic oxide wire having a width of less than 0.1 $\mu$m, and a thickness of less than 1000 Å. The achieved wiring thickness is in a range from about 400 Å to 1000 Å. The width of superconducting wire is limited by the capabilities of photolithography equipment, and is in range greater than about 0.01 $\mu$m. Superconducting wire formed by the inventive method has advantages over the prior art. One advantage is that a whole order of magnitude for lateral-wiring miniaturization is accomplished by forming superconductive wiring lines below the sub-tenth micron metallization line width range. Another advantage is that the vertical profile of wiring layers is also significantly reduced.

Figure 4:
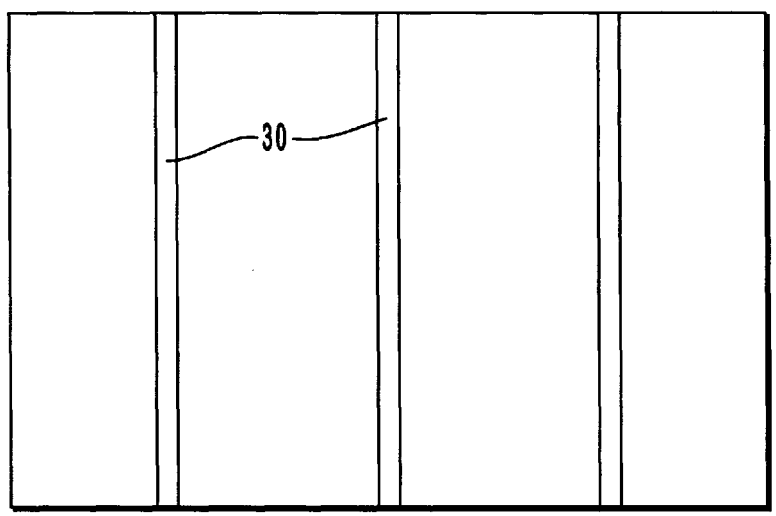
FIG. 4 shows a top planar view of precursor metallization lines superposed upon complementary compound oxides or metals prior to a reactive treatment step that leaves self-insulated superconductor metallization lines.

FIG. 4 illustrates, for either the seed layer or the ion-implantation methods described above, a top planar view of precursor metallization lines 30 superposed upon complementary compound oxides or metals prior to a reactive treatment step that leaves self-insulated superconductor metallization lines. Metallization lines 30 will preferably be composed of copper or an oxide doped with copper.

In either the seed layer or the ion-implantation methods described above, it is sometimes useful to deposit or implant a stoichiometric excess of metal required to make the superconductive metal lines. The excess metal can be either the indigenous metal required to form the superconductor ceramic or can be a noble metal such as silver or gold that is implanted either simultaneously or serially to the required precursor compound. The effect of an excess of metal that stoichiometrically cannot react with the complementary compound is that a sheath, ribbon, or husk of metallization intermingles with the reacted, and now superconductive, components. This sheath, ribbon or husk of metallization imparts a ductile integrity to the device wiring. The ductile nature of the device wiring allows for further creation of superconductor material during the remainder of high-temperature processing as small amounts of precursor oxide will continue to react at the fringes of the metallization lines. This excess stoichiometric metal amount furthers the ductile quality of the superconducting wire. A benefit of the ductile quality of the superconducting wire is that the metal sheath, ribbon, or intermingled husk resists brittle fractures. Brittle fractures can be induced by pressures in the process flow, such as CMP pressures upon a LOCOS or upon a deposited oxide layer.

The amount of metallization that is to be intermingled with the complimentary compound depends upon the specific application. For example, when excess metallization is desirable only to assure complete reaction of the complimentary compound in the region proximate the metallization, a slight stoichiometric excess is preferred. For example, a preferred amount of excess ion-implanted metallization is in a range from about 1.0 to about 2.0 stoichiometric. A more preferred amount is in a range from about 1.2 to about 1.8 stoichiometric. A most preferred amount is in a range from about 1.4 to about 1.6 stoichiometric. When excess metallization is preferred in order to impart a ductile integrity to the metallization line, up to ten times the require stoichiometric amount of metallization is preferred. A preferred amount of excess ion-implanted metallization for this application is in a range from about 1 to about 10 stoichiometric. A more preferred amount is in a range from about 3 to about 8 stoichiometric. A most preferred amount is in a range from about 5 to about 6 stoichiometric. Qualitatively, the preferred excess metal is silver although copper can be used as the primary precursor metal and then excess metal can be an addition of either copper or silver.

The step of treating the metal-compound composite at sufficient conditions to react the precursor compound with the metal to form a high-temperature superconductive ceramic ("reactive treatment step"), as set forth in either method above, can involve heating in oxidative or protective atmospheres and alternative pressing techniques. Where the last treatment for the semiconductor device is to be an anneal step, the anneal step can be postponed and performed simultaneously with the reactive treatment step. The reactive treatment step can be performed in an oxygen environment where there is a non-oxidized compound that is complementary to the metal. If, on the other hand, the postponed anneal is required in the presence of a protective atmosphere, a precursor oxide such as $YBaO_x$ can be deposited and oxidation of the device will be localized only to the metal layer as it reacts to complete the circuit wiring as a superconductor ceramic.

The reactive treatment step will preferably be conducted at a temperature in a range from about 300° C. to about 1300° C. A more preferred temperature for the reactive treatment step is from about 300° C. to about 1100° C. A most preferred temperature for the reactive treatment step is from about 400° C. to about 900° C.

In some superconductor fabricating methods, a precompaction step must be performed in order to place the precursor elements or compounds in sufficient proximity to allow them to react. The precompaction step may be necessary since the superconductor formation process is a solid-to-solid reaction. Precompaction of superconductors is carried out by pressing, extruding, and rolling, among other methods. With a fabricated semiconductor device, only pressing, and preferably isostatic pressing, is feasible because rolling and extruding of the semiconductor device would destroy the structures that are the essence of the device. Isostatic pressing accomplishes an omni-directional pressure that places the device in an environment in which pressure gradients harmful to the microstructure of the device would not be experienced.

Isostatic pressing can be accomplished by covering the device with an impermeable photoresist "glove," placing the device in a pressure medium chamber, and applying an isostatic fluid pressure onto the device through the fluid medium. After pressing, the photoresist is removed by standard techniques such as stripping or global etching that does not attack the underlying structures. An option to etching off the glove or to removing the glove by stripping or etching is to burn off the glove in a heat treatment. In such a heat treatment, oxygen atoms are introduced which remove the photoresist compound and react with the underlying structure to create the superconductor oxide ceramics of the present invention. Due to the pressure, oxygen atoms more effectively contact the underlying precursor compound.

Isostatic pressing can also be accomplished by placing the device in an inert pressure medium that is large enough to avoid intermingling of the superconductive precursor materials, and then applying a quasi-isostatic pressure by pressing the device in a piston-type chamber. This type of pressure medium must be highly fluent, although it is a solid material. Hot isostatic pressing in an oxygen environment could also be utilized.

Pressure treatment is advantageously used more often with the first embodiment of the present invention (i.e., sputtering and patterning a metal seed line either before or after a complementary compound deposition thereon), where the two required layers are merely layered in contact one to another, as opposed to ion implantation in which the two required elements are intimately intermingled at the molecular scale.

Where a last anneal is required for the fabrication of the semiconductor device, the last anneal can be postponed until the reactive treatment step. The reactive treatment step can require both applied heat and pressure in order to accomplish formation of a superconductor ceramic. Where only heat is required, the preferred temperature conditions are set forth above. Where simultaneous pressure and heat, sequential pressure and heat, or sequential heat and pressure are required, care for the physical integrity of the semiconductor device become a processing factor. The reactive treatment step is preferably conducted at pressures in a range from about 100 KPa to about 120 MPa. A more preferred pressure for the reactive treatment step is in a range from about 2 MPa to about 100 MPa. A most preferred reactive treatment step is in a range from about 10 MPa to about 90 MPa.

Figure 5:
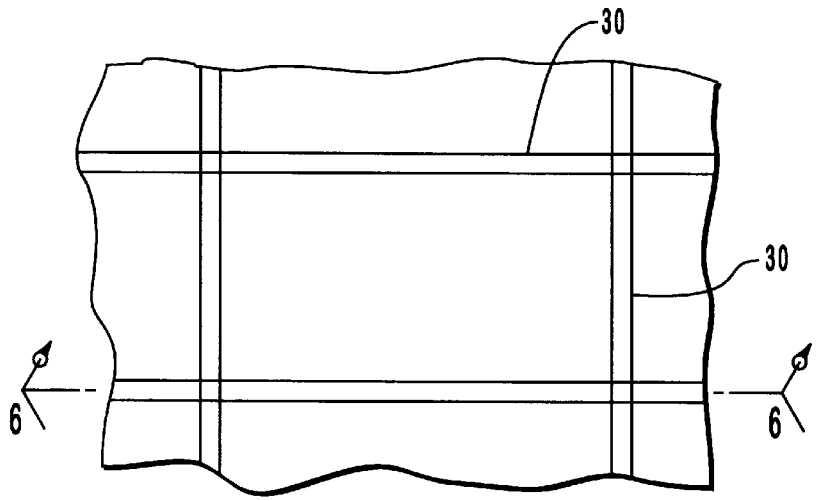
FIG. 5 shows a top planar view of the conventional criss-cross geometry of metal line wiring with dielectric layers therebetween.

Integrated circuit wiring is limited by dielectric interlayer thicknesses and the "pinch" of lateral wiring widths required to be placed upon a given surface. FIG. 5 illustrates a plan view of typical criss-cross wiring 30 of integrated circuits having insulative dielectric layers (not shown) between the lines of wiring 30. In contrast with the present invention, however, the dielectric layers are either ultra thin compared to a conventional dielectric layer for wiring 30, or a dielectric layer is not required with a superconducting metal line. Vias (not shown in FIG. 5) allow for interlevel contact where an electrical connection is required in the integrated circuit layout.

Figure 6:
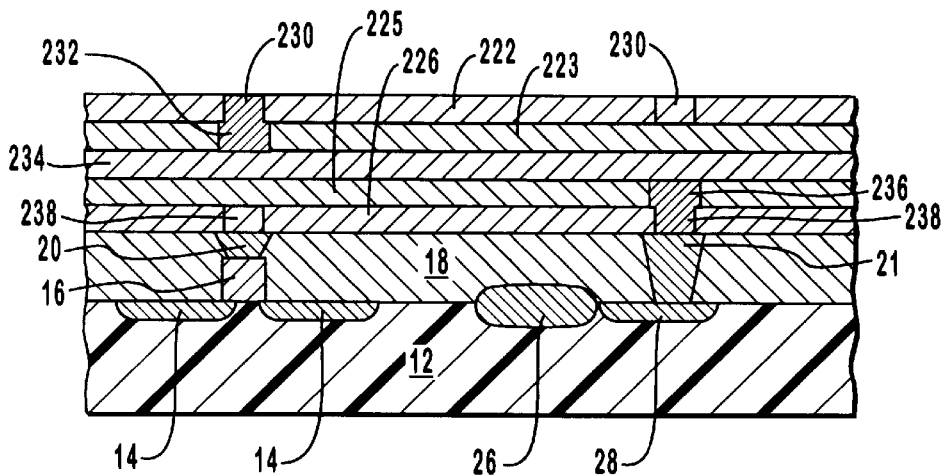
FIG. 6 shows a resultant structure using the present inventive method, where a cross-sectional view taken through the line 6—6 in FIG. 5 is depicted.

FIG. 6 is a cross-section of a line taken along section line F—F of FIG. 5, and 8 shows a metallization line 230 imbedded in a dielectric 222, and a metallization line 238 imbedded in a dielectric 226. A metallization line 234 is imbedded in a dielectric that is not seen in FIG. 5. Alternatively and in accordance with the present invention, metallization line 230 can be imbedded in an unreacted compound 222, and metallization line 238 can be imbedded in an unreacted compound 226. Metallization line 234, in the alternative embodiment of the inventive method, is imbedded in an unreacted compound that is not seen in FIG. 6. Metallization lines 230, 234, 238, which are processed to be high-temperature superconductive ceramic oxide layers, run either perpendicular or parallel to page of FIG. 6. FIG. 6 depicts vias 232, 236 that are metal-filled and make interlevel connections, respectively, through dielectric layers 223 and 225.

In the present invention, the dielectric layer thicknesses can be made substantially thinner than conventional prior art dielectric layers because no capacitance phenomenon is encountered due to the superconductivity of the metallization lines. A dielectric thickness range from about 10 Å to about 5000 Å is preferred. A more preferred range is from about 100 Å to about 1000 Å. A most preferred thickness is about 500 Å.

Figure 7:
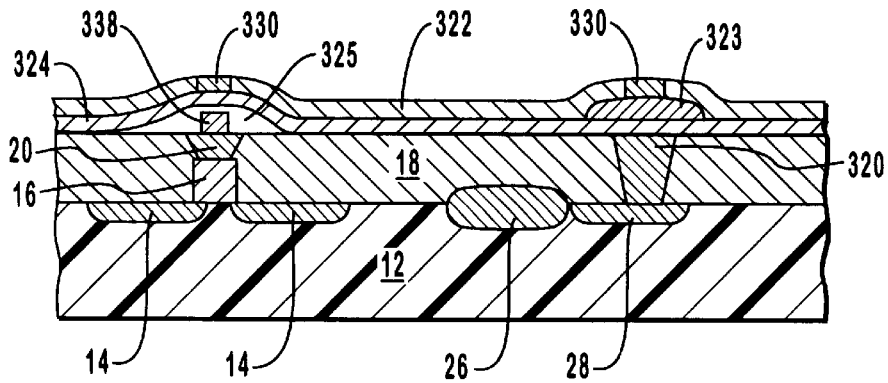
FIG. 7 shows a an alternative embodiment of the resultant structure seen in FIG. 6, where a cross-sectional view taken through the line 6—6 in FIG. 5 is depicted.

A benefit of thinner circuit lines is that a denser lateral wiring can be used. Additionally, vertical dielectric layers can be thinner, or the dielectric layers can be nonexistent depending upon the wiring layout. FIG. 7 illustrates a functionally similar wiring scheme as that of FIG. 6, but features minimal dielectric layers 323 and 325. Dielectric layers 323 and 325 can be minimized because the capacitance problem is eliminated by virtue of the superconductivity of the metallization lines. Superconductive metallization lines 330, 324, and 338 connect to other structures, including copper filled vias 20, 320. Layer 322 is composed of silicon dioxide by way of non-limiting example. The overall profile seen in FIG. 7 is lower than the overall profile of the equivalent wiring seen in FIG. 6 because dielectric layers 323 and 325 have been minimized.

In the present invention, a first circuit structure is formed by depositing a first seed layer and blanketing an optional oxide layer over the first seed layer. The first seed layer may optionally be patterned. Following the first step, a second seed layer is superposed over the first seed layer, but no shorting will occur. The absence of shorting is due to either sufficient lateral spacing because of thinner lines, or due to a minimized inter-level dielectric layer that is thinner than the prior art owing to the lack of capacitance build-up problems.

The circuits have thinner lines by ion implanting a thin patterned circuit into a complementary compound. The subsequent circuits are wired with thinner lines allowing for denser patterned wiring than previously achievable due to the superconductive nature of the wiring. Unwanted crosstalk interference is not encountered because capacitance build up between the lines is substantially eliminated.

The present invention provides a method of wiring integrated circuits on a substrate assembly with a high-temperature superconducting material to overcome the Joule-heating phenomenon. The electromigration phenomenon caused by prolonged Joule heating is substantially eliminated. The electromigration phenomenon is due to resistive current flow that results from electron crowding and metal ion diffusion because of resistance in the superconductive wiring. The unwanted capacitance phenomenon between metal lines is substantially eliminated, which phenomenon is due to induced charges caused by the potential differential between metal lines separated by ever-thinner dielectric layers. Where resistance drops to zero, the capacitance also drops to negligible levels even at the submicron scale. Using high-temperature superconductors wiring, there is substantially eliminated the possibility of unwanted capacitance in the wires, while the traditional capacitor materials retain their non-superconducting qualities at the temperatures required to achieve high-temperature superconductivity, thus not defeating the capacitance requirements of integrated circuit capacitors as they were designed to be used.

The inventive method achieves multiple-layer integrated circuit wiring that requires no intermediate planarization due to the extreme thinness of the superconducting wiring and dielectric layers. Enhanced solid state performance for a device fabricated with the inventive method is realized where the semiconductor device operates in the liquid nitrogen temperature range. In this temperature range, a side effect for device performance is that the entire device is "frozen out", meaning that molecular and interatomic vibrations are significantly lowered and the effects of dislocations are minimized. This "tighter" solid state device performs more efficiently and the superconductive wiring further enhances device performance.

The present invention produces thinner wiring lines of superconductive material that cannot be achieved under the previous state of the art with photolithographic and sputtering techniques. Patterned ion-implantation of preferred metals into preferred dielectric oxide compounds that are stoichiometrically complementary to the preferred metals, and reaction of the preferred metals with the preferred complementary compounds, only in the ion-implanted pattern, creates self-insulated high-temperature superconductor wiring within unreacted oxide. Ion-implanted pattern line widths can be significantly thinner than photolithographic sputtered line widths by reason of sub-tenth micron ion beam width capabilities.

Where one mode of carrying out the invention is to employ an oxide that is not the metal-less complement of a superconductor, a conventional field oxide can be etched to remove wiring channels and the metal-less complement of a preferred superconductor compound can be filled into the wiring channels. After planarization of the metal-less complement of a preferred superconductor compound, a line of ion-implanted metal that complements the metal-less compound is implanted in a width that is significantly thinner than the filled wiring channel. The whole structure is then subjected to a reactive treatment to react the metal and the metal-less compound to form the preferred superconductor.

The present invention produces superconductive wiring layers that are separated by no dielectric layers, or by thinner dielectric layers than the previously achieved state of the art, while retaining proper anti-shorting qualities. By achievement of thinner or nonexistent layers, the device is able to be even thinner than the previous state of the art. This facilitates continued miniaturization, and eliminates unwanted capacitance build up in the wiring.

The present invention produces self-insulating electrical connections for completed integrated circuits. Where a complementary superconductor compound can only react with the required metal if it is present (by ion implantation or otherwise), the electrical connections will be self insulating due to the unreacted and unconverted oxide compound that surrounds the converted superconducting metal lines.

The present invention may be embodied in other specific forms without departing from its spirit or essential characteristics. The described embodiments are to be considered in all respects only as illustrated and not restrictive. The scope of the invention is, therefore, indicated by the appended claims rather than by the foregoing description. All changes which come within the meaning and range of equivalency of the claims are to be embraced within their scope.

What is claimed and desired to be secured by United States Letters Patent is:

1. An integrated circuit comprising:
   an electrically conductive structure situated upon a semiconductor substrate and within an insulating layer situated upon the semiconductor substrate;
   a superconductive ceramic oxide layer that:
   is superconductive at temperatures of about 150° K and below;
   is situated on the insulating layer;
   is electrically connected with the electrically conductive structure;
   is composed of a material including a compound and a metal oxide; and
   is in contact with a layer composed of said compound.

2. The integrated circuit as defined in claim 1, wherein the superconductive ceramic oxide layer is composed of a yttrium barium copper oxide superconductor;
   the compound is composed of yttrium barium or the oxide thereof; and
   the metal oxide is copper oxide.

3. The integrated circuit as defined in claim 1, wherein the superconductive ceramic oxide layer has a width of less than 0.1 μm and a thickness of less than 1000 Å.

4. The integrated circuit as defined in claim 1, wherein the compound is superconductive when reacted with said metal oxide or the metal of said metal oxide.

5. The integrated circuit as defined in claim 1, wherein:
the electrically conductive structure is a gate; and
a conductive plug is in contact with the gate and extends to contact the superconductive ceramic oxide layer situated on the insulating layer.

6. An integrated circuit comprising:
an electrically conductive structure situated upon a semiconductor substrate and within an insulating layer situated upon the semiconductor substrate;
a yttrium barium copper oxide superconductor film that is superconductive at temperatures of about 150° K and below and is situated upon the insulating layer; and
a layer composed of composed of yttrium barium or yttrium barium oxide in contact with the yttrium barium copper oxide superconductor film.

7. The integrated circuit as defined in claim 6, wherein the yttrium barium copper oxide superconductor film:
is electrically connected with the electrically conductive structure;
has a width of less than 0.1 μm; and
has a thickness of less than 1000 Å.

8. The integrated circuit as defined in claim 6, further comprising:
a conductive plug in contact with the electrically conductive structure and extending to contact the yttrium barium copper oxide superconductor film situated on the insulating layer.

9. An integrated circuit comprising:
an electrically conductive structure situated upon a semiconductor substrate and within a first insulating layer situated upon the semiconductor substrate;
a yttrium barium copper oxide superconductor film that is:
superconductive at temperatures of about 150° K and below;
is situated on the first insulating layer;
is electrically connected with the electrically conductive structure;
has a width of less than 0.1 μm;
has a thickness of less than 1000 Å; and
in contact with a layer composed of composed of yttrium barium or yttrium barium oxide;
a conductive plug in contact with the electrically conductive structure and extending to contact the yttrium barium copper oxide superconductor film situated on the insulating layer.

10. An integrated circuit comprising:
a gate on a semiconductor substrate in contact with an active area therein, the gate being within a first insulating layer situated upon the semiconductor substrate;
a first superconductive ceramic oxide layer composed of a superconductive ceramic oxide that is superconductive at temperatures of about 150° K and below situated on the first insulating layer and being electrically connected with the gate; and
a compound layer in contact with the first superconductive ceramic oxide layer, wherein the compound layer is composed of a compound which is forms said superconductive ceramic oxide when reacted with a metal oxide or the metal of said metal oxide.

11. The integrated circuit as defined in claim 10, wherein:
the first superconductive ceramic oxide layer is composed of a yttrium barium copper oxide superconductor film; and
the compound layer is composed of yttrium barium or yttrium barium oxide.

12. The integrated circuit as defined in claim 10, wherein the first superconductive ceramic oxide layer has a width of less than 0.1 μm, and a thickness of less than 1000 Å.

13. The integrated circuit as defined in claim 10, wherein a conductive plug is in contact with the gate and extends to contact the first superconductive ceramic oxide layer situated on the insulating layer.

14. The integrated circuit as defined in claim 10, wherein:
the first superconductive ceramic oxide layer is situated within a second insulating layer situated upon the first insulating layer;
a third insulating layer is situated upon the second insulating layer;
a second superconductive ceramic oxide layer that is superconductive at temperatures of about 150° K and below is situated on the third insulating layer; and
a fourth insulating layer is situated upon the second superconductive ceramic oxide layer.

15. The integrated circuit as defined in claim 14, wherein said first and second superconductive ceramic oxide layers each comprise excess stoichiometric metal in the range of about 1 to about 10.

16. The integrated circuit as defined in claim 14, wherein at least one of the first and second superconductive ceramic oxide layers has a width of less than 0.1 μm, and a thickness of less than 1000 Å.

17. The integrated circuit as defined in claim 15, wherein a conductive plug is in contact with the gate and extends to contact the first superconductive ceramic oxide layer situated on the first insulating layer.

18. An integrated circuit comprising:
a gate on a semiconductor substrate in contact with an active area therein, the gate being within a first insulating layer situated upon the semiconductor substrate;
a yttrium barium copper oxide superconductor film that:
is superconductive at temperatures of about 150° K and below;
is situated on the first insulating layer;
is electrically connected with the gate;
has a width of less than 0.1 μm;
has a thickness of less than 1000 Å; and
is in contact with a layer composed of composed of yttrium barium or yttrium barium oxide;
a conductive plug in contact with the gate and extending to contact the yttrium barium copper oxide superconductor film situated on the insulating layer.

19. An integrated circuit comprising:
a gate on a semiconductor substrate in contact with an active area in the semiconductor substrate, the gate being within a first insulating layer situated upon the semiconductor substrate;
a first superconductive ceramic oxide layer that is superconductive at temperatures of about 150° K and below situated on the first insulating layer and being electrically connected with the gate, the first superconductive ceramic oxide layer being within a second insulating layer situated upon the first insulating layer;
a second superconductive ceramic oxide layer that is superconductive at temperatures of about 150° K and below situated on both the first and second insulating layers; and
a third superconductive ceramic oxide layer that is superconductive at temperatures of about 150° K and below situated on the second superconductive ceramic oxide layer.

20. The integrated circuit as defined in claim 19, wherein at least one of the first, second, and third superconductive ceramic oxide layers is composed of a yttrium barium copper oxide superconductor film.

21. The integrated circuit as defined in claim 19, wherein at least one of the first, second, and third superconductive ceramic oxide layers has a width of less than 0.1 μm, and a thickness of less than 1000 Å.

22. The integrated circuit as defined in claim 19, wherein a conductive plug is in contact with the gate and extends to contact the first superconductive ceramic oxide layer situated on the first insulating layer.

23. An integrated circuit comprising:
   a gate on a semiconductor substrate in contact with an active area in the semiconductor substrate, the gate being within a first insulating layer situated upon the semiconductor substrate;
   a first superconductive ceramic oxide layer that is superconductive at temperatures of about 150° K and below situated on the first insulating layer and being electrically connected with the gate, the first superconductive ceramic oxide layer being within a second insulating layer situated upon the first insulating layer;
   a second superconductive ceramic oxide layer that is superconductive at temperatures of about 150° K and below situated on both the first and second insulating layers; and
   a third superconductive ceramic oxide layer that is superconductive at temperatures of about 150° K and below situated on the second superconductive ceramic oxide layer;
   a conductive plug in contact with the gate and extending to contact the first superconductive ceramic oxide layer situated on the first insulating layer;
      wherein at least one of the first, second, and third superconductive ceramic oxide layers is composed of a yttrium barium copper oxide superconductor film.

24. The integrated circuit as defined in claim 23, wherein at least one of the first, second, and third superconductive ceramic oxide layers is in contact with yttrium barium or yttrium barium oxide.

25. The integrated circuit as defined in claim 24, wherein:
   said at least one of the first, second, and third superconductive ceramic oxide layers has opposing sides that make contact with said yttrium barium or yttrium barium oxide.

26. The integrated circuit as defined in claim 1, wherein:
   the superconductive ceramic oxide layer has opposing sides that make contact with said layer composed of said compound; and
   said compound is superconductive when reacted with said metal oxide or the metal of said metal oxide.

27. The An integrated circuit as defined in claim 6, wherein the yttrium barium copper oxide superconductor film has opposing sides that make contact with said layer composed of composed of yttrium barium or yttrium barium oxide.

28. The integrated circuit as defined in claim 15, further comprising a third superconductive ceramic oxide layer that is:
   superconductive at temperatures of about 150° K and below;
   situated on the second superconductive ceramic oxide layer; and
   within the fourth insulating layer.

29. The integrated circuit as defined in claim 19, wherein at least one of the first, second, and third superconductive ceramic oxide layers is:
   composed of a material including a compound and a metal oxide; and
   is in contact with a layer composed of said compound which is superconductive when reacted with said metal oxide or the metal of said metal oxide.

30. The integrated circuit as defined in claim 29, wherein:
   said at least one of the first, second, and third superconductive ceramic oxide layers has opposing sides that make contact with said layer composed of said compound.

31. A metallized structure comprising:
   a structure situated on a substrate assembly and having an upper surface;
   a first layer upon the upper surface of the structure;
   a compound upon the upper surface of the structure; and
   a superconductive ceramic oxide that is superconductive at temperatures not more than 150° K and is situated above the first layer of the compound, wherein:
      either said first layer or said compound is composed of a metal or a metal oxide; and
      the other of said first layer or said compound is in contact with the superconductive ceramic oxide and is superconductive when reacted with said metal or the oxide thereof.

32. The metallized structure as defined in claim 31, wherein:
   the superconductive ceramic oxide is composed of a yttrium barium copper oxide superconductor film;
   either said first layer or said compound is composed of copper or copper oxide; and
   the other of said first layer or said compound is composed of yttrium barium or yttrium barium oxide.

33. The metallized structure as defined in claim 31, wherein:
   the first layer is composed of said metal having a stoichiometric excess in the range of about 1 to about 10; and
   the compound is superconductive when reacted with the first layer.

34. The metallized structure as defined in claim 31, wherein:
   the first layer has a two dimensional shape; and
   the superconductive ceramic oxide has the two dimensional shape of the first layer.

35. The metallized structure as defined in claim 31, wherein the superconductive ceramic oxide has:
   a width of less than 0.1 microns; and
   a thickness of less than 1000 angstroms.

36. The metallized structure as defined in claim 31, further comprising a plurality of multiple layers upon said substrate assembly, each said multiple layer comprising:
   a base layer having an upper surface;
   a secondary layer upon said upper surface of said base layer;
   a compound upon said upper surface of the base layer; and
   a superconductive ceramic oxide that is superconductive at temperatures not more than 150° K, wherein:
      either said secondary layer or said compound is composed of a metal or a metal oxide; and the other of said secondary layer or said compound is in contact with the superconductive ceramic oxide and is superconductive when reacted with said metal or the oxide thereof.

37. The metallized structure as defined in claim 36, wherein:
the secondary layer of one of the multiple layers is composed of a different material than the secondary layer of another of the multiple layers;
the compound of one of the multiple layers is composed of a different material than the compound of another of the multiple layers.

38. The metallized structure as defined in claim 36, wherein the superconductive ceramic oxide of at least one multiple layer of said plurality of the multiple layers has:
a width of less than 0.1 microns; and
a thickness of less than 1000 angstroms.

39. The metallized structure as defined in claim 31, wherein:
the first layer is composed of a material selected from copper, barium, yttrium, rare earth metals, thallium, strontium, gold, silver, bismuth, their oxides, or combinations thereof; and
the compound is composed of a material that is complementary to the first layer in that said superconductive ceramic oxide is formed by reacting said material of the compound with the first layer.

40. The metallized structure as defined in claim 39, wherein the superconductive ceramic oxide is intermingled with an excess of said metal that is in a range from about 1 to about 3 stoichiometric.

* * * * *

UNITED STATES PATENT AND TRADEMARK OFFICE
CERTIFICATE OF CORRECTION

PATENT NO. : 6,087,711
DATED : July 11, 2000
INVENTOR(S) : John H. Givens

It is certified that error appears in the above-identified patent and that said Letters Patent are hereby corrected as shown below:

Col. 10, ln. 59: after "claim 1," change "wherein" to --wherein:--

Col. 11, ln. 44: after "layer" delete --composed of--

Col 12, ln. 44: after "layer" delete --composed of--

Col. 13, ln. 30: before "superconductive" delete --second--

Col. 13, ln. 55: before "An integrated" delete --The--

Signed and Sealed this

Twenty-second Day of May, 2001

*Attest:*

NICHOLAS P. GODICI

*Attesting Officer*   *Acting Director of the United States Patent and Trademark Office*